United States Patent
Tsuchiya et al.

(10) Patent No.: US 12,029,019 B2
(45) Date of Patent: Jul. 2, 2024

(54) ELECTROMAGNETIC WAVE TRANSMISSIVE COVER AND SENSOR MODULE

(71) Applicant: TOYODA GOSEI CO., LTD., Kiyosu (JP)

(72) Inventors: Yosuke Tsuchiya, Kiyosu (JP); Koji Fukagawa, Kiyosu (JP); Risa Hirano, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 18/340,970

(22) Filed: Jun. 26, 2023

(65) Prior Publication Data
US 2024/0032267 A1    Jan. 25, 2024

(30) Foreign Application Priority Data
Jul. 21, 2022   (JP) ................................. 2022-116637

(51) Int. Cl.
*H05K 9/00*   (2006.01)

(52) U.S. Cl.
CPC ......... *H05K 9/0081* (2013.01); *H05K 9/0015* (2013.01); *H05K 9/0094* (2013.01)

(58) Field of Classification Search
CPC ... H05K 9/0081; H05K 9/0015; H05K 9/0094
See application file for complete search history.

(56) References Cited

U.S. PATENT DOCUMENTS

| | | | | |
|---|---|---|---|---|
| 2016/0297437 A1* | 10/2016 | Hara | ...................... | G01S 7/4813 |
| 2019/0036205 A1* | 1/2019 | Suzuki | ...................... | H01Q 1/42 |
| 2021/0408675 A1* | 12/2021 | Doke | ...................... | G01S 7/027 |
| 2022/0137229 A1* | 5/2022 | Hirose | .................. | G01S 7/4811 |
| | | | | 250/338.1 |
| 2023/0100012 A1* | 3/2023 | Hirano | ..................... | H01Q 1/42 |
| | | | | 356/4.01 |
| 2024/0053441 A1* | 2/2024 | Tsuchiya | .................. | G01S 7/027 |

FOREIGN PATENT DOCUMENTS

JP    2020-079053 A    5/2020

\* cited by examiner

*Primary Examiner* — Hung V Ngo
(74) *Attorney, Agent, or Firm* — Posz Law Group, PLC

(57) ABSTRACT

An electromagnetic wave transmissive cover is configured to be employed in a vehicle to which a sensor device is attached. The electromagnetic wave transmissive cover includes a cover body that is attached to the vehicle and covers the sensor device from a front side in an emission direction of the electromagnetic waves, and a seal member that provides a seal between the sensor device and the cover body. The seal member includes an attachment base portion that is attached to the cover body while surrounding the electromagnetic wave transmissive portion, and an annular hollow seal portion that is coupled to the attachment base portion and is in contact with the sensor device while surrounding the electromagnetic wave transmissive portion.

8 Claims, 5 Drawing Sheets

ELECTROMAGNETIC WAVE TRANSMISSIVE COVER AND SENSOR MODULE

BACKGROUND

1. Field

The present disclosure relates to an electromagnetic wave transmissive cover that covers a sensor device from the front in an emission direction of electromagnetic waves, and a sensor module including the sensor device and the electromagnetic wave transmissive cover.

2. Description of Related Art

For example, Japanese Laid-Open Patent Publication No. 2020-79053 discloses a sensor module including a sensor device and an electromagnetic wave transmissive cover.

The sensor device is attached to a vehicle and emits electromagnetic waves such as near-infrared rays toward the outside of the vehicle. The sensor device receives electromagnetic waves reflected by an object outside the vehicle. Based on the emitted and received electromagnetic waves, the sensor device, for example, recognizes an object outside the vehicle, detects a distance between the vehicle and the object, and detects a relative velocity between the vehicle and the object. An electromagnetic wave transmissive portion is formed at a front end portion of a case, which forms an outer shell of the sensor device. The sensor device performs emission and reception of electromagnetic waves through the electromagnetic wave transmissive portion.

The framework of the electromagnetic wave transmissive cover includes a cover body. The cover body covers the sensor device from the front in the emission direction of electromagnetic waves.

Further, in the sensor module described in the above publication, the sensor device and the electromagnetic wave transmissive cover are separately attached to the vehicle.

However, water and debris enter the sensor module described in the above publication through the gap between the sensor device and the cover body. When water and debris collect the electromagnetic wave transmissive portion, electromagnetic waves are absorbed by the water and debris. This can reduce the detection performance of the sensor device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electromagnetic wave transmissive cover is configured to be employed in a vehicle to which a sensor device is attached. The sensor device includes an electromagnetic wave transmissive portion and is configured to emit and receive electromagnetic waves through the electromagnetic wave transmissive portion. The electromagnetic wave transmissive cover includes a cover body and a seal member. The cover body is attached to the vehicle and covers the sensor device from a front side in an emission direction of the electromagnetic waves. The seal member provides a seal between the sensor device and the cover body. The seal member includes an attachment base portion and an annular hollow seal. The attachment base portion is attached to the cover body while surrounding the electromagnetic wave transmissive portion. The annular hollow seal portion is coupled to the attachment base portion and is in contact with the sensor device while surrounding the electromagnetic wave transmissive portion.

In another general aspect, a sensor module includes a sensor device, an electromagnetic transmissive cover, and a seal member. The sensor device is configured to be attached to a vehicle, includes an electromagnetic wave transmissive portion, and is configured to emit and receive electromagnetic waves through the electromagnetic wave transmissive portion. The electromagnetic transmissive cover is configured to be attached to the vehicle and includes a cover body, the cover body covering the sensor device from a front side in an emission direction of the electromagnetic waves. The seal member provides a seal between the sensor device and the cover body. One of the cover body and the sensor device serves as an attachment object to which the seal member is attached, and the other one of the cover body and the sensor device serves as a contact object with which the seal member is in contact. The seal member includes an attachment base portion and an annular hollow seal portion. The attachment base portion is attached to the attachment object while surrounding the electromagnetic wave transmissive portion. The annular hollow seal portion is coupled to the attachment base portion and is in contact with the contact object while surrounding the electromagnetic wave transmissive portion.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described.

Modifications and equivalents of the methods, apparatuses, and/or systems described are apparent to one of ordinary skill in the art. Sequences of operations are exemplary, and may be changed as apparent to one of ordinary skill in the art, except for operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

The term "annular" as used in this description may refer to any structure that forms a loop, which is a continuous shape with no ends. "Annular" shapes include but are not limited to a circular shape, an elliptic shape, and a polygonal shape with sharp or rounded corners.

First Embodiment

A sensor module 20 for a land vehicle 10 according to a first embodiment will now be described with reference to FIGS. 1 to 4.

In the following description, the direction in which the land vehicle 10 advances forward will be referred to as the front, and the reverse direction will be referred to as the rear. The vertical direction refers to the vertical direction of the land vehicle 10, and the left-right direction refers to the vehicle width direction that matches with the left-right direction when the land vehicle 10 is advancing forward.

Figure 1:
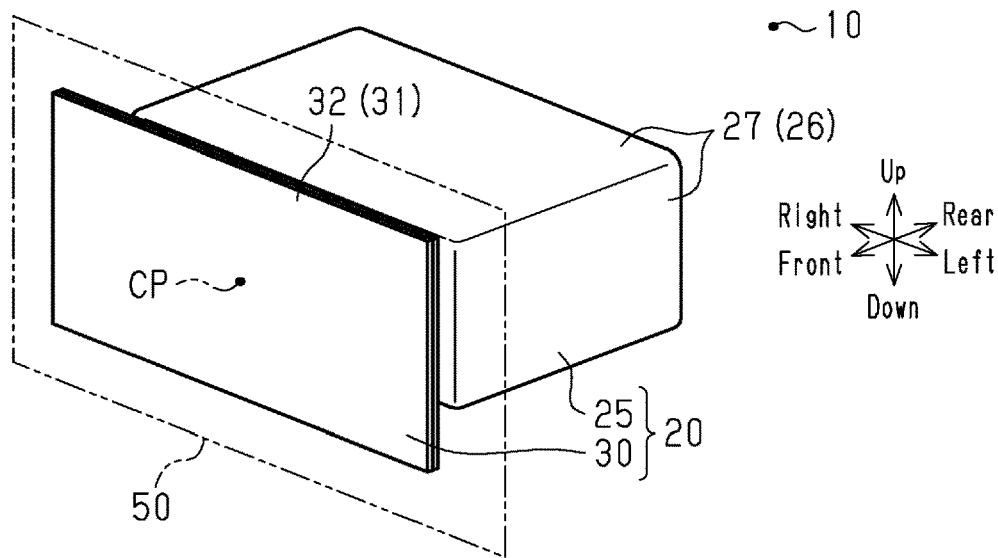
FIG. 1 is a perspective view of a sensor module according to a first embodiment.

As shown in FIG. 1, the sensor module 20 is mounted on the land vehicle 10 and includes a sensor device 25 and an electromagnetic wave transmissive cover 30. The components of the sensor module 20 will now be described.

<Sensor Device 25>

Figure 2:
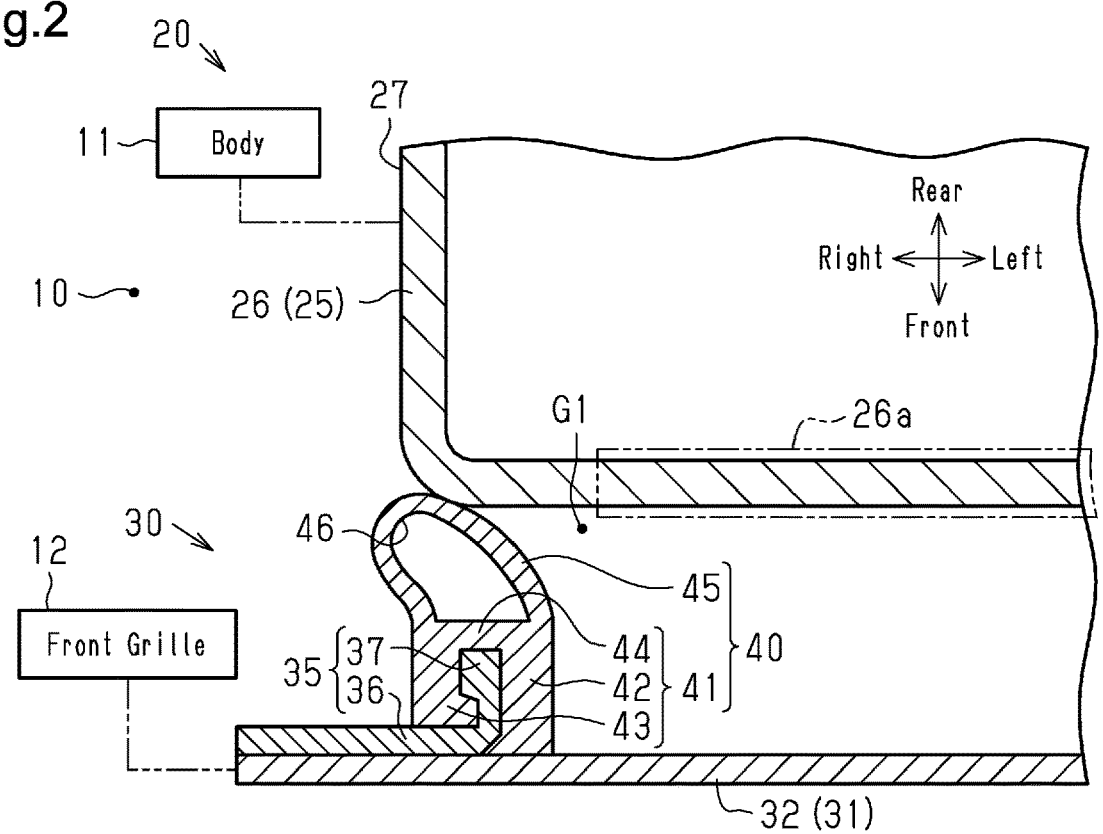
FIG. 2 is a cross-sectional plan view partially showing the sensor module according to the first embodiment.

As shown in FIG. 2, a front grille 12 is disposed at a front end portion of a body 11 of the land vehicle 10. The sensor device 25 is attached to a part of the body 11 that is rearward of the front grille 12. In the first embodiment, the sensor device 25 includes a near-infrared sensor for forward monitoring. The near-infrared sensor emits electromagnetic waves, specifically, near-infrared rays having wavelengths of 700 nm to 2500 nm, forward of the land vehicle 10, and receives near-infrared rays reflected by objects outside the land vehicle 10, including preceding vehicles, pedestrians, and the like. The sensor device 25 recognizes objects outside the land vehicle 10 based on the emitted and received electromagnetic waves, and detects the distance, the relative velocity, and the like between the land vehicle 10 and the object.

As described above, since the sensor device 25 emits electromagnetic waves (near-infrared rays) forward of the land vehicle 10, the emission direction of electromagnetic waves by the sensor device 25 is a direction from the rear to the front of the land vehicle 10. The front in the emission direction of the electromagnetic waves substantially agrees with the front of the land vehicle 10. The rear in the emission direction also substantially agrees with the rear of the land vehicle 10. Accordingly, in the following description, the front in the emission direction of electromagnetic waves will simply be referred to as "forward" or "front." The rear in the emission direction will simply be referred to as "rearward" or "rear."

As shown in FIGS. 1 and 2, the outer shape of the sensor device 25 is formed by a case 26. In the first embodiment, the case 26 has a rectangular parallelepiped shape that is longer in the front-rear direction and in the vehicle width direction (left-right direction) than in the vertical direction. The case 26 incorporates an emitting unit, which emits electromagnetic waves, and a receiving unit, which receives electromagnetic waves. The illustration of the internal structure of the sensor device 25 is omitted in FIGS. 2 and 3. The same applies to FIG. 5, which illustrates a second embodiment, and FIGS. 6 and 7, which illustrate a third embodiment. Further, the same applies to FIGS. 8 to 10, which illustrate modifications.

As indicated by the long-dash double-short-dash line in FIG. 2, the case 26 includes an electromagnetic wave transmissive portion 26a, which is transmissive to electromagnetic waves (near-infrared rays) at a front end portion. The emission and reception of electromagnetic waves are performed through the electromagnetic wave transmissive portion 26a.

<Electromagnetic Wave Transmissive Cover 30>

Figure 3:
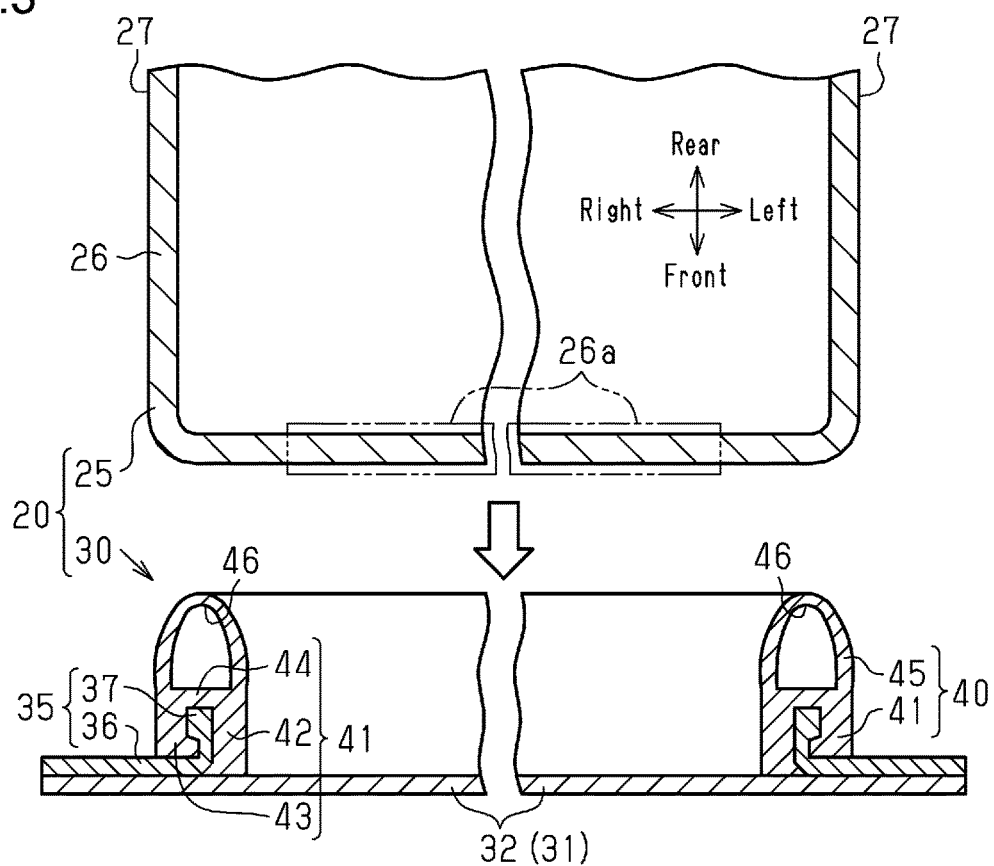
FIG. 3 is an exploded cross-sectional plan view partially showing the sensor module according to the first embodiment, illustrating a state before the gap between a sensor device and a cover body is sealed.
Figure 4:
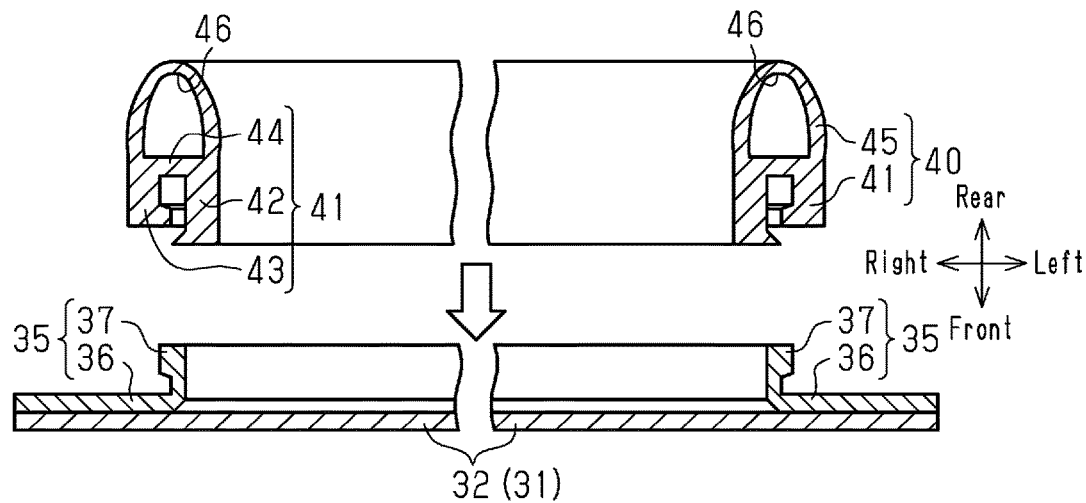
FIG. 4 is an exploded cross-sectional plan view partially showing a cover body and a seal member according to the first embodiment, illustrating a state before the seal member is attached the cover body.

As shown in FIGS. 3 and 4, the framework of the electromagnetic wave transmissive cover 30 includes a cover body 31. The cover body 31 includes a plate-shaped portion 32 disposed forward of the sensor device 25. The plate-shaped portion 32 has the shape of a rectangular plate that is longer in the vehicle width direction (left-right direction) than in the up-down direction. The cover body 31, which includes the plate-shaped portion 32, has a function of covering the sensor device 25 from the front, and also has a function as a decoration for the front end portion of the land vehicle 10.

The plate-shaped portion 32 may be formed of a single layer of an electromagnetic wave transmissive material. In this case, the plate-shaped portion 32 may be made of, for example, a polycarbonate (PC) plastic. The plate-shaped portion 32 may have a layer structure in which multiple layers each being transmissive to electromagnetic waves are stacked in the front-rear direction. In this case, the layers may include a decorative layer.

The electromagnetic wave transmissive cover 30 is attached to the front grille 12 at the cover body 31 by screw fastening, a snap-fit structure, or the like.

<Sealing Structure>

As shown in FIG. 3, the sensor module 20 is provided with a sealing structure that prevents water and debris from entering a clearance G1 (see FIG. 2) between the sensor device 25 and the cover body 31.

As shown in FIGS. 3 and 4, the sealing structure includes a seal member 40 that seals the clearance G1. One of the cover body 31 and the sensor device 25 serves as an attachment object to which the seal member 40 is attached, and the other serves as a contact object with which the seal member 40 is in contact, In the first embodiment, the cover body 31 is the attachment object, and the sensor device 25 is the contact object.

In order to attach the seal member 40 to the cover body 31, an attachment portion 35 is formed at a peripheral edge portion of the rear surface of the plate-shaped portion 32 by a plastic molding method such as a two-color molding method. The attachment portion 35 includes a plate-shaped base portion 36 and a rectangular annular hook portion 37. The base portion 36 is stacked on and joined to the peripheral edge portion of the rear surface of the plate-shaped portion 32. The hook portion 37 protrudes rearward from the base portion 36.

The seal member 40 includes an attachment base 41 and a hollow seal portion 45. The attachment base 41 has a rectangular annular shape, and is attached to the cover body 31 to surround the electromagnetic wave transmissive portion 26a.

As shown in FIG. 1, an imaginary plane that is orthogonal to the emission direction of electromagnetic waves (near-infrared rays) from the sensor device 25 and on which the sensor device 25 and the hollow seal portion 45 are projected is referred to as a projection plane 50. In the projection plane 50, a center portion CP of each of the sensor device 25 and the hollow seal portion 45 is defined as a reference. In the projection plane 50, the direction, the side, or the like toward the center portion CP is referred to as "inward", "inside", "inner side", or the like, and the direction, the side, or the like away from the center portion CP is referred to as "outward", "outside", "outer side", or the like.

As shown in FIGS. 3 and 4, in the first embodiment, a part of the peripheral edge portion of the plate-shaped portion 32 protrudes outward beyond an outer surface 27 of the sensor device 25. The outer surface 27 includes the upper surface, the lower surface, the left side surface, and the right side surface of the case 26, and does not include the front surface or the rear surface. Therefore, the attachment portion 35, which is formed on the peripheral edge portion of the cover body 31, in particular, a part of the base portion 36, protrudes outward beyond the outer surface 27 of the sensor device 25.

The hook portion 37 has a shape with a recess and protrusion (undercut shape) in the inward and outward directions. In addition, a boundary portion between the base portion 36 and the hook portion 37 also has a shape with a recess and protrusion in the inward and outward directions.

The attachment base 41 includes an inner portion 42, an outer portion 43, and a coupling portion 44. The inner portion 42 has a rectangular annular shape and is disposed inward of the hook portion 37. The outer portion 43 has a rectangular annular shape and is disposed outward of the hook portion 37. Each of the inner portion 42 and the outer portion 43 has a shape with a recess and protrusion (undercut shape) in the inward and outward directions in correspondence with the shape of the attachment portion 35. The coupling portion 44 is located rearward of the hook portion 37 and connects the rear end portion of the inner portion 42 and the rear end portion of the outer portion 43. The inner portion 42 and the outer portion 43 sandwich the hook portion 37 from the inner and outer sides and are engaged with the hook portion 37. This engagement restricts the attachment base 41 from moving in the front-rear direction, the vehicle width direction (left-right direction), and the up-down direction with respect to the attachment portion 35. The size of the attachment base 41 in the front-rear direction is approximately half the size of the clearance G1 in the front-rear direction.

The hollow seal portion 45 is formed in a rear portion of the attachment base 41 and has a rectangular annular shape. The hollow seal portion 45 has a hollow portion 46 between itself and the attachment base 41. The attachment base 41 and the hollow seal portion 45 are integrally formed by an extrusion molding method using a soft material such as urethane plastic or thermoplastic elastomer (TPE). In a state in which the sensor device 25 is attached to the body 11 and the electromagnetic wave transmissive cover 30 is not yet attached to the front grille 12, the hollow seal portion 45 is not elastically deformed and protrudes straight rearward from the attachment base 41. The size of the hollow seal portion 45 in the front-rear direction is larger than half the size of the clearance G1 in the same direction.

The size of the seal member 40 (the attachment base 41 and the hollow seal portion 45) in the front-rear direction before the attachment is larger than the size of the clearance G1 in the front-rear direction.

As shown in FIG. 2, in a state in which the sensor device 25 is attached to the body 11 and the electromagnetic wave transmissive cover 30 is attached to the front grille 12, the hollow seal portion 45 is in contact with the sensor device 25 in an elastically deformed state while surrounding the electromagnetic wave transmissive portion 26a.

The shape of the hollow seal portion 45 when elastically deformed by contact with the sensor device 25 is not particularly limited. Although FIG. 2 illustrates an example in which the outer part of the hollow seal portion 45 is elastically deformed to collapse outward from the attachment base 41, the hollow seal portion 45 may be elastically deformed in other directions. In addition, the hollow seal portion 45 may be elastically deformed such that the inner portion and the outer portion have symmetrical shapes, that is, in a state in which the hollow seal portion 45 does not collapse in the inward or outward direction.

Further, FIG. 2 illustrates an example in which a part of the hollow seal portion 45 that is in contact with the sensor device 25 in an elastically deformed state protrudes further outward beyond the outer surface 27 of the sensor device 25.

Operation of the first embodiment, which is configured as described above, will now be described.

As shown in FIG. 2, the clearance G1 is formed between the sensor device 25 attached to the body 11 and the cover body 31 attached to the front grille 12. In the clearance G1, the seal member 40 is disposed at a position surrounding the electromagnetic wave transmissive portion 26a. The cover body 31 is the attachment object, to which the seal member 40 is attached, and the sensor device 25 is a contact object, with which the seal member 40 is in contact. The attachment base 41 of the seal member 40 is attached to the cover body 31 while surrounding the electromagnetic wave transmissive portion 26a. The hollow seal portion 45 of the seal member 40 is coupled to the attachment base 41 and is in contact with the sensor device 25 while surrounding the electromagnetic wave transmissive portion 26a.

Therefore, the seal member 40 prevents water and debris from entering a region in the clearance G1 that is surrounded by the seal member 40.

The first embodiment has the following advantages.

(1-1) In the first embodiment, as shown in FIG. 2, the seal member 40, which has the annular attachment base 41 and the annular hollow seal portion 45, is disposed between the cover body 31 and the sensor device 25. The attachment base 41 is attached to the cover body 31, and the hollow seal portion 45, which surrounds the electromagnetic wave transmissive portion 26a, is brought into contact with the sensor device 25.

Therefore, the clearance G1 is sealed by the seal member 40. This prevents water and debris from collecting on the electromagnetic wave transmissive portion 26a and thus prevents the detection performance of the sensor device 25 from deteriorating due to collected water and debris.

(1-2) As a water shutoff structure between two components, a sealing structure using a seal member made of a foam sheet, a seal member having a lip shape, or the like is known. In either case, a seal member is attached to one component and pressed against the other component. The seal member is elastically deformed to seal the clearance between the two components. However, the amount of elastic deformation of the sealing material is small. Therefore, the situation in which sealing can be performed by the sealing member is limited to the case in which the clearance between the two components is small.

In the first embodiment, the objects to be sealed are the sensor device 25 and the cover body 31. The sensor device 25 is attached to the body 11, and the cover body 31 is attached to the front grille 12. Thus, the clearance G1 is large and the tolerance is also large. Therefore, it is difficult to seal the clearance G1 with a typical sealing member as described above.

In this regard, in the first embodiment, the seal member 40, which includes the attachment base 41 and the hollow seal portion 45, is used for sealing as shown in FIG. 2. The attachment base 41 and the hollow seal portion 45 are arranged in correspondence with the arrangement direction of the sensor device 25 and the cover body 31. Also, the size of the attachment base 41 in the front-rear direction is approximately half the size of the clearance G1 in the front-rear direction. The size of the hollow seal portion 45 in the front-rear direction before being elastically deformed is larger than half the size of the clearance G1 in the front-rear direction. Therefore, in the clearance G1, a rectangular annular region surrounding the electromagnetic wave transmissive portion 26a is filled with the attachment base 41 and the hollow seal portion 45.

In addition, since the seal member 40 includes the hollow portion 46, the amount of possible elastic deformation of the hollow seal portion 45 is larger than the amount of possible elastic deformation of each of a seal member made of a foam sheet and a seal member having a lip shape.

Thus, the first embodiment can seal a relatively large clearance such as the clearance G1, and thus achieves the advantage (1-1) discussed above.

(1-3) In order to remove dirt collected on the sensor module 20, high-pressure washing water W1 may be sprayed on the sensor module 20 from behind when the vehicle 10 is washed.

The peripheral edge portion of the electromagnetic wave transmissive cover 30 protrudes outward beyond the outer surface 27 of the sensor device 25. Therefore, the pressure of the sprayed washing water W1 may be applied to the protruding portion.

In this regard, in the first embodiment, the base portion 36 of the attachment portion 35 overlaps with the peripheral edge portion of the plate-shaped portion 32. At the place where the base portion 36 is overlapped, the thickness of the electromagnetic wave transmissive cover 30 in the front-rear direction is increased by the thickness of the base portion 36, and the rigidity is increased. This is effective in limiting deformation of the protruding part of the electromagnetic wave transmissive cover 30 when sprayed with the high-pressure washing water W1.

Second Embodiment

Figure 5:
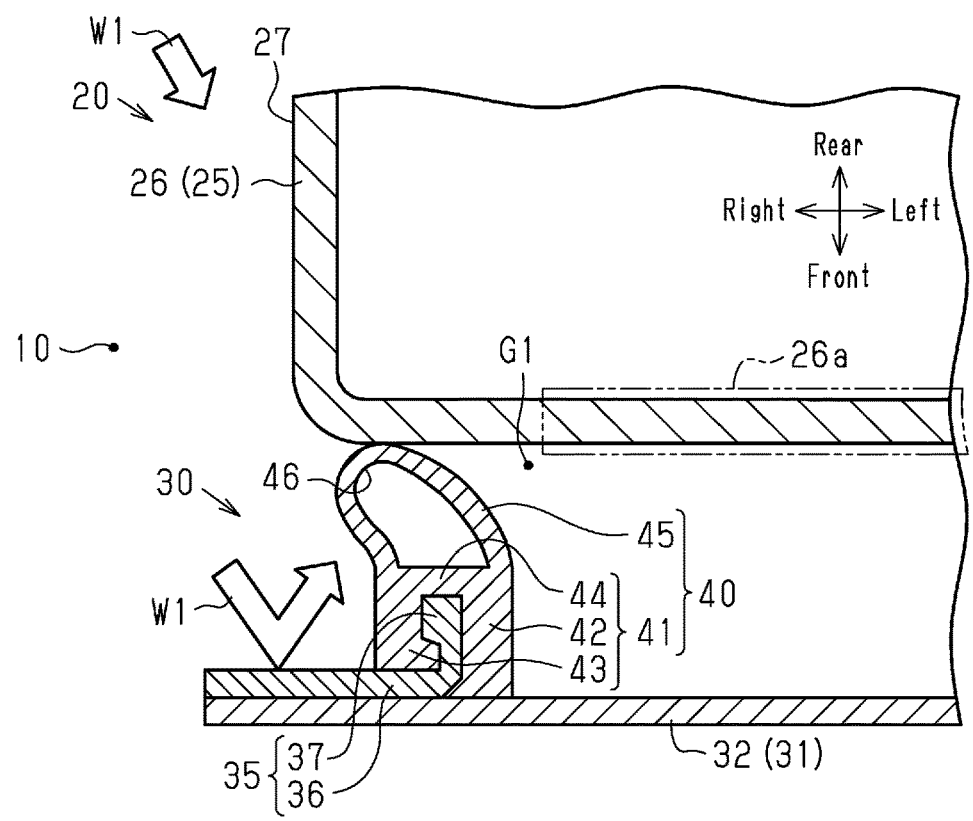
FIG. 5 is a cross-sectional plan view partially showing a sensor module according to a second embodiment.

Next, a sensor module 20 for a land vehicle according to a second embodiment will be described with reference to FIG. 5.

In the second embodiment, the entire hollow seal portion 45, which is elastically deformed by contact with the sensor device 25, is located inward of the outer surface 27 of the sensor device 25 while surrounding the electromagnetic wave transmissive portion 26a. In this respect, the second embodiment is different from the first embodiment in which part of the hollow seal portion 45 is located outward of the outer surface 27.

The configuration, other than the above, is the same as the first embodiment. Thus, in the second embodiment, the same components as those in the first embodiment are given the same reference numerals, and detailed explanations are omitted. The features of the second embodiment that are common to those of the first embodiment include that the hollow seal portion 45 is elastically deformed to collapse outward due to contact with the sensor device 25. Also, in both the first embodiment and the second embodiment, the peripheral edge portions of the plate-shaped portion 32 and the base portion 36 protrude outward beyond the outer surface 27 of the sensor device 25.

Operation of the second embodiment will now be described.

At the time of washing the vehicle 10 described in the above item (1-3), if the high-pressure washing water W1 is directly sprayed on the hollow seal portion 45, the hollow seal portion 45 is elastically deformed in a direction away from the sensor device 25 by the washing water W1. The high-pressure washing water W1 may pass between the elastically deformed hollow seal portion 45 and the sensor device 25 and enter a region of the clearance G1 surrounded by the seal member 40.

In this regard, in the second embodiment in which the outer surface 27 of the sensor device 25 is located outward of the hollow seal portion 45, at least some of the washing water W1 is blocked by the sensor device 25. The hollow seal portion 45 receives minimal direct spray from the washing water W1, which is jetted from the rear side of the sensor module 20.

Thus, the second embodiment achieves the following advantages in addition to the advantages of the items (1-1) to (1-3).

(2-1) In the second embodiment, the entire hollow seal portion 45 elastically deformed to collapse outward due to contact with the sensor device 25 is located inward of the outer surface 27 of the sensor device 25. This prevents the hollow seal portion 45 from being elastically deformed in a direction away from the sensor device 25 due to direct spraying of the high-pressure washing water W1 on the hollow seal portion 45. The washing water W1 is thus prevented from passing between the elastically deformed hollow seal portion 45 and the sensor device 25 to enter the region of the clearance G1 surrounded by the seal member 40.

(2-2) In the second embodiment, part of the peripheral edge portion of the plate-shaped portion 32 and part of the base portion 36 of the attachment portion 35 are located outward of the seal member 40 and the outer surface 27 of the case 26. Therefore, when the high-pressure washing water W1 is sprayed toward the base portion 36 as shown by the arrow in FIG. 5 at the time of washing the vehicle 10, the washing water W1 hits the base portion 36, rebounds, and hits the hollow seal portion 45 from the obliquely front outer side. The hollow seal portion 45 is elastically deformed toward the sensor device 25 by the rebounding washing water W1. Therefore, the hollow seal portion 45 comes into stronger contact with the sensor device 25, improving the sealing performance.

Third Embodiment

A sensor module 20 for a land vehicle according to a third embodiment will now be described with reference to FIGS. 6 and 7.

In the land vehicle 10 to which the sensor device 25, which emits and receives electromagnetic waves, is attached, an adjustment work referred to as an aiming process is performed in order to operate the sensor device 25 properly. In the aiming process, the inclination, the attachment position, and the like of the sensor device 25 are adjusted. Therefore, due to the aiming process, at least a part (outer part) of the hollow seal portion 45 may come into contact with the sensor device 25 while being elastically deformed to collapse outward as shown in FIG. 6.

If the elastically deformed part of the hollow seal portion 45 protrudes outward beyond the outer surface 27 of the sensor device 25, the high-pressure washing water W1 may be sprayed on the protruding part of the hollow seal portion 45 when the vehicle 10 is washed. In this case, the protruding part of the hollow seal portion 45 may be elastically deformed in a direction away from the sensor device 25 due to the pressure of the sprayed washing water W1, leading to a reduction in the sealing performance.

In this regard, similarly to the first embodiment, the third embodiment is made on the assumption that a part of the hollow seal portion 45 that is elastically deformed to collapse outward due to contact with the sensor device 25 protrudes outward beyond the outer surface 27 of the sensor device 25. In addition, the cover body 31 of the third embodiment includes a tubular peripheral wall portion 33. In this regard, the third embodiment is different from the first embodiment, in which the cover body 31 does not include the peripheral wall portion 33.

Figure 7:
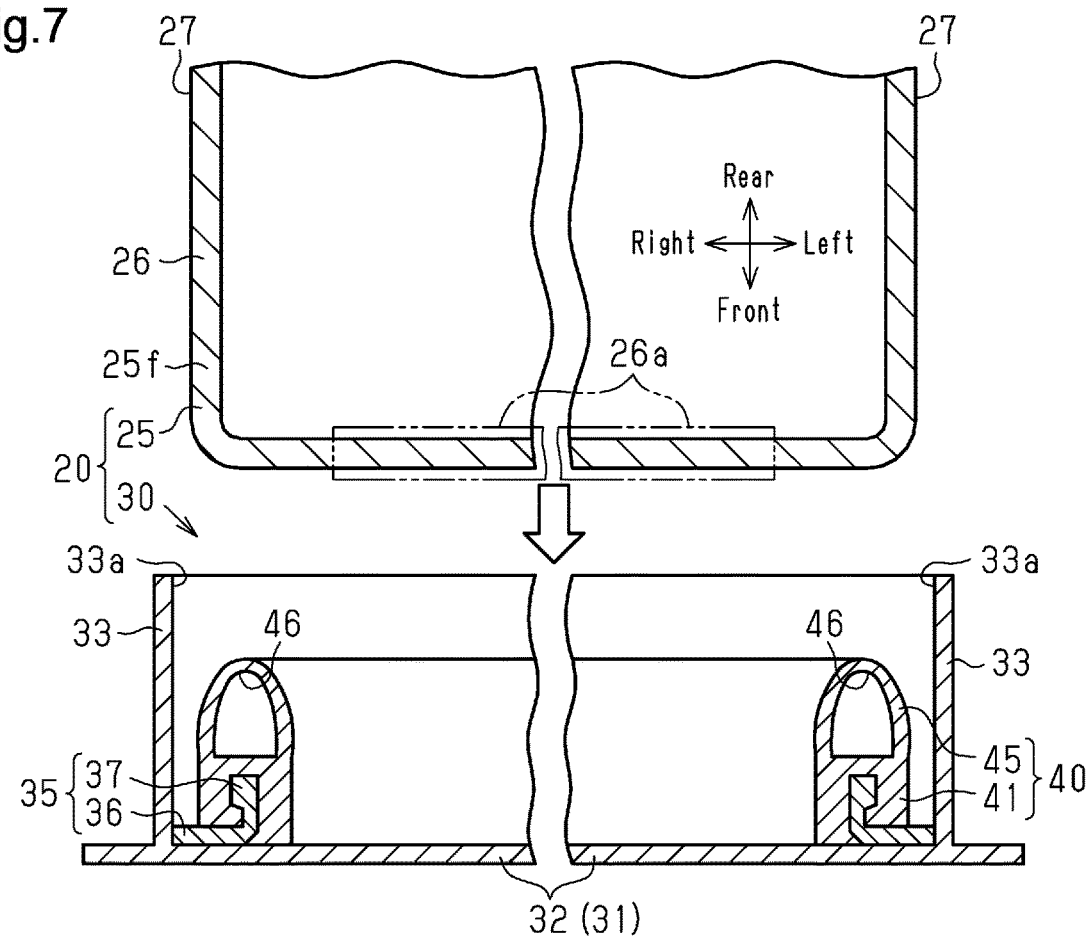
FIG. 7 is an exploded cross-sectional plan view partially showing the sensor module according to the third embodiment, illustrating a state before the gap between a sensor device and a cover body is sealed.

As shown in FIG. 7, the peripheral wall portion 33 is formed using, for example, a plastic (PC plastic) similar to that of the plate-shaped portion 32. The peripheral wall portion 33 extends rearward from the plate-shaped portion 32 while surrounding the seal member 40. The peripheral wall portion 33 is separated outward from the attachment base 41. The peripheral wall portion 33 may be in contact with the base portion 36 of the attachment portion 35 or may be separated outward from the base portion 36. In a state in which the sensor device 25 is attached to the body 11 and the electromagnetic wave transmissive cover 30 is not yet attached to the front grille 12, an inner wall surface 33a of the peripheral wall portion 33 is separated outward from the hollow seal portion 45 before being elastically deformed. The peripheral wall portion 33 has the shape of a rectangular tube with an open rear end. The peripheral wall portion 33 may be formed integrally with the plate-shaped portion 32 or may be formed separately from the plate-shaped portion 32.

Figure 6:
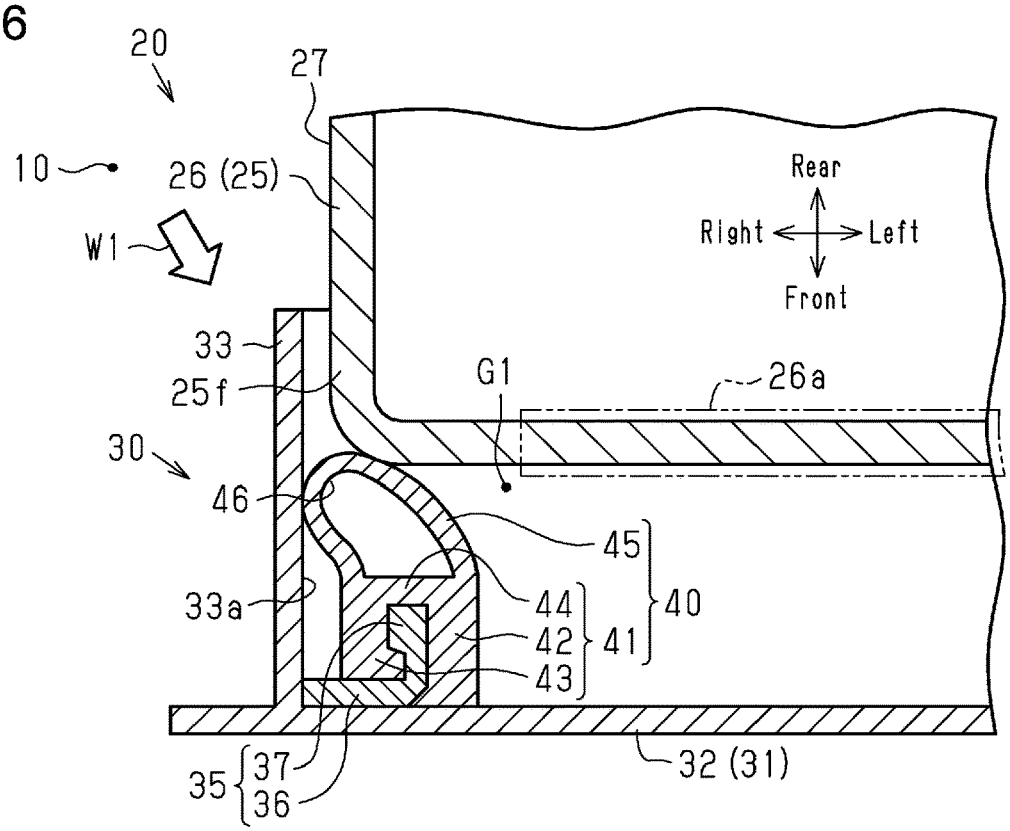
FIG. 6 is a cross-sectional plan view partially showing a sensor module according to a third embodiment.

Further, as shown in FIG. 6, the peripheral wall portion 33 extends rearward beyond the elastically deformed hollow seal portion 45 and surrounds at least a front part 25f of the sensor device 25. In the third embodiment, the rear end of the peripheral wall portion 33 is located rearward of the rear end of the hollow seal portion 45 before elastic deformation (see FIG. 7). A part of the inner wall surface 33a of the peripheral wall portion 33 that surrounds the sensor device 25 is spaced outward from the outer surface 27 of the sensor device 25.

When collapsing outward due to the aiming process, the hollow seal portion 45 contacts the inner wall surface 33a of the peripheral wall portion 33 at a position (part of the outer portion) different from the contact position with the sensor device 25.

The configuration, other than the above, is the same as the first embodiment. Thus, in the third embodiment, the same components as those in the first embodiment are given the same reference numerals, and detailed explanations are omitted.

Operation of the third embodiment will now be described.

At the time of washing the vehicle 10, when high-pressure washing water W1 is sprayed toward the sensor module 20 from the rear, at least some of the washing water W1 is blocked by the peripheral wall portion 33. Compared with a case in which the peripheral wall portion 33 is not provided, the washing water W1 is less likely to be directly sprayed on the hollow seal portion 45. Further, the pressure of the washing water W1 is reduced by hitting the peripheral wall portion 33. The hollow seal portion 45 is unlikely to be elastically deformed in a direction away from the sensor device 25 when the high-pressure washing water W1 is sprayed toward the hollow seal portion 45.

In particular, in the third embodiment, the high-pressure washing water W1 cannot reach the hollow seal portion 45 unless it passes between the front part 25f of the sensor device 25 and the part of the peripheral wall portion 33 that surrounds the front part 25f.

The hollow seal portion 45 is not only in contact with the sensor device 25 but also in contact with the inner wall surface 33a of the peripheral wall portion 33. Therefore, even if the washing water W1 is sprayed, the pressure of the washing water W1 is received by the sensor device 25 and the peripheral wall portion 33 via the hollow seal portion 45. Since the washing water W1 is received at the two positions, the hollow seal portion 45 is unlikely to be elastically deformed.

Particularly, even if the hollow seal portion 45 were to be elastically deformed away from the sensor device 25, such elastic deformation would be restrained by the peripheral wall portion 33, which surrounds the hollow seal portion 45. Therefore, elastic deformation of the hollow seal portion 45 in a direction away from the sensor device 25 is restricted by the peripheral wall portion 33.

Thus, the third embodiment achieves the following advantages in addition to the advantages of the items (1-1) and (1-2).

(3-1) In the third embodiment, the peripheral wall portion 33 extending rearward from the plate-shaped portion 32 surrounds the seal member 40.

Therefore, at the time of washing the vehicle 10, the peripheral wall portion 33 restricts the high-pressure washing water W1 from being directly sprayed on the hollow seal portion 45. This configuration prevents the hollow seal portion 45 from being elastically deformed in a direction away from the sensor device 25 due to the spraying of the high-pressure washing water W1, thereby preventing the sealing performance from being degraded.

In addition, elastic deformation of the hollow seal portion 45 is restricted at two locations: the sensor device 25 and the peripheral wall portion 33. The hollow seal portion 45 is held in contact with the sensor device 25, so that more stable sealing performance is achieved. This configuration is thus effective in achieving the advantages of the items (1-1) and (1-2).

(3-2) In the third embodiment, the peripheral wall portion 33 extends rearward beyond the hollow seal portion 45 and surrounds the front part 25f of the sensor device 25.

This configuration enhances the ability of the peripheral wall portion 33 to prevent the high-pressure washing water W1 from being directly sprayed on the hollow seal portion 45. The elastic deformation of the hollow seal portion 45 caused by the spraying of the washing water W1 is made even less likely to occur. This enhances the advantage of the item (3-1).

The third embodiment achieves the advantage of the following item (1-3'), which is related to the item (1-3).

(1-3') In the third embodiment, the base portion 36 of the attachment portion 35 overlaps with the plate-shaped portion 32. The thickness of the electromagnetic wave transmissive cover 30 in the front-rear direction is increased by the thickness of the overlapped base portion 36. This increases the rigidity of the part of the electromagnetic wave transmissive cover 30 to which the seal member 40 is attached, and thus prevents that part from being deformed.

The above-described embodiments may be modified as follows. The above-described embodiments and the following modifications can be combined if the combined modifications remain technically consistent with each other.

<Attachment Object and Contact Object of Seal Member 40>

Figure 8:
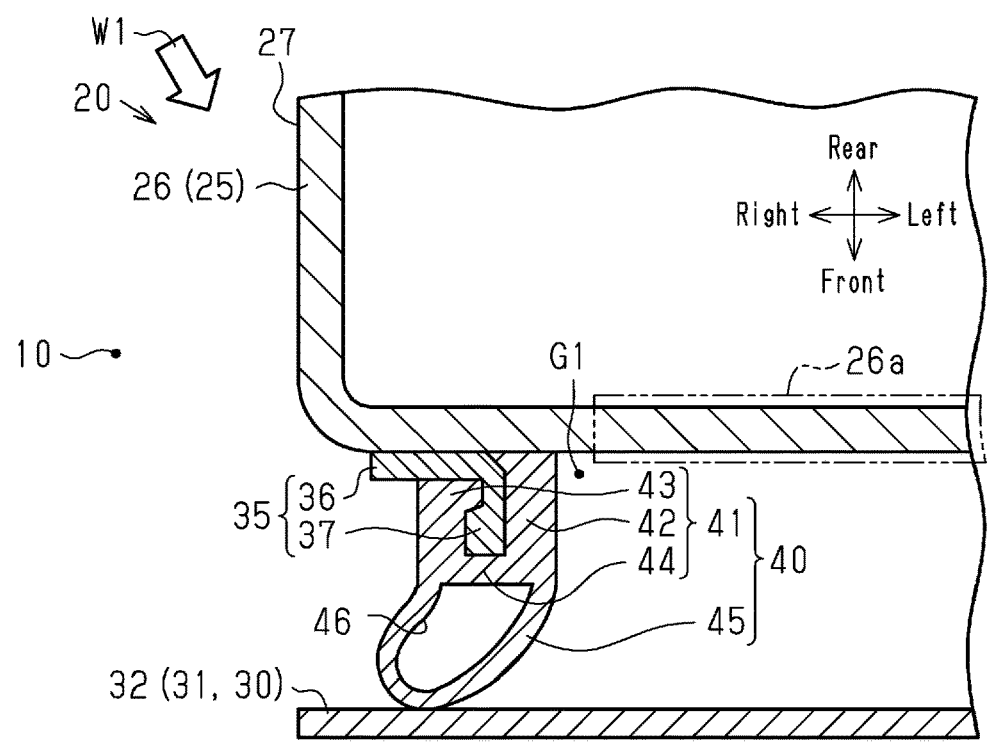
FIG. 8 is a cross-sectional plan view partially illustrating a sensor module according to a modification.

One of the cover body 31 and the sensor device 25 may serve as an attachment object to which the seal member 40 is attached, and the other one of the cover body 31 and the sensor device 25 may serve as a contact object with which the seal member 40 is in contact, Therefore, contrary to the first embodiment, the sensor device 25 may serve as an attachment object, and the cover body 31 may serve as a contact object, as shown in FIG. 8.

In the modification shown in FIG. 8, the same components as those in the first embodiment are given the same reference numerals, and detailed explanations are omitted.

In the modification shown in FIG. 8, the annular attachment base 41 of the seal member 40 is attached to the case 26 of the sensor device 25 while surrounding the electromagnetic wave transmissive portion 26a. Further, the annular hollow seal portion 45 of the seal member 40 is joined to the attachment base 41 and brought into contact with the plate-shaped portion 32 while surrounding the electromagnetic wave transmissive portion 26a.

In this modification, the relationship between the attachment object and the contact object of the seal member 40 is inverse to that in the first embodiment. However, this modification and the first embodiment both have the seal member 40 disposed in the clearance G1 between the sensor device 25 and the cover body 31 to surround the electromagnetic wave transmissive portion 26a. Therefore, the seal member 40 prevents water debris from entering a region in the clearance G1 that is surrounded by the seal member 40.

Therefore, this modification has the same advantages of the items (1-1) to (1-3) in the first embodiment.

In the modification shown in FIG. 8, the positional relationship between the sensor device 25 and the seal member 40 may be set such that the entirety of the hollow seal portion 45, which is elastically deformed by contact with the plate-shaped portion 32, is located inward of the outer surface 27 of the sensor device 25.

In this modification, the outer surface 27 of the case 26 is located outward of the hollow seal portion 45. Thus, when the high-pressure washing water W1 is sprayed toward the sensor module 20 from the rear, at least some of the washing water W1 is blocked by the sensor device 25. The washing water W1 is unlikely to be directly sprayed on the hollow seal portion 45.

Therefore, this modification has the same advantages of the item (2-1) in the second embodiment.

Figure 9:
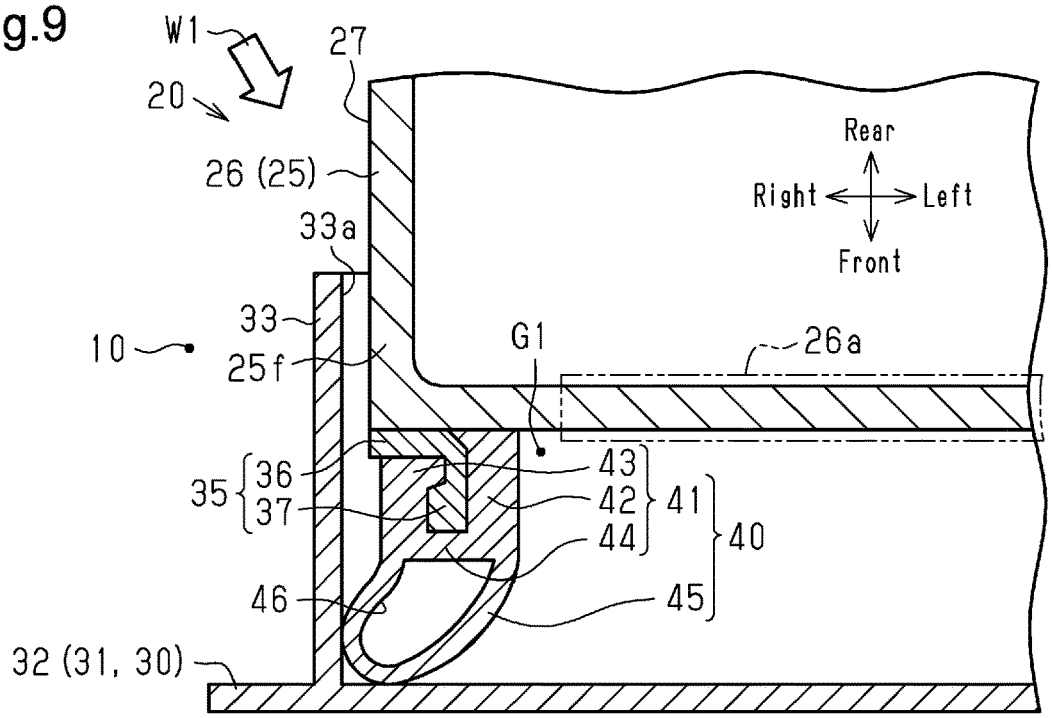
FIG. 9 is a cross-sectional plan view partially illustrating a sensor module according to a modification.

This modification is made on the assumption that the sensor device 25 is the attachment object, to which the seal member 40 is attached, and the cover body 31 is the contact object, with which the seal member 40 is in contact. In addition, as shown in FIG. 9, a part (outer part) of the hollow seal portion 45 that is elastically deformed to collapse outward may protrude outward beyond the outer surface 27 of the sensor device 25. Furthermore, the cover body 31 may be provided with the peripheral wall portion 33 in addition to the plate-shaped portion 32.

The peripheral wall portion 33 may extend rearward from the plate-shaped portion 32 while surrounding the seal member 40, and may have the shape of a rectangular tube with an open rear end. The peripheral wall portion 33 may be formed integrally with the plate-shaped portion 32 or may be formed separately from the plate-shaped portion 32.

Furthermore, the peripheral wall portion 33 may extend rearward beyond the attachment base 41 to surround at least the front part 25f of the sensor device 25. A part of the inner wall surface 33a of the peripheral wall portion 33 that surrounds the sensor device 25 may be separated outward from the outer surface 27 of the sensor device 25.

A part of the hollow seal portion 45 different from the part that is in contact with the plate-shaped portion 32 may be in contact with the inner wall surface 33a of the peripheral wall portion 33.

In the modification shown in FIG. 9, the same components as those in the third embodiment are given the same reference numerals, and detailed explanations are omitted.

With the modification shown in FIG. 9, at the time of washing the vehicle 10, when high-pressure washing water W1 is sprayed toward the sensor module 20 from the rear, at least some of the washing water W1 is blocked by the peripheral wall portion 33. Compared with a case in which the peripheral wall portion 33 is not provided, the washing water W1 is less likely to be directly sprayed on the hollow seal portion 45. Further, the pressure of the washing water W1 is reduced by hitting the peripheral wall portion 33. The hollow seal portion 45 is unlikely to be elastically deformed when the washing water W1 is sprayed directly on the hollow seal portion 45.

Particularly, in the modification shown in FIG. 9, the peripheral wall portion 33 surrounds the front part 25f of the sensor device 25. Therefore, the high-pressure washing water W1 cannot reach the hollow seal portion 45 unless it passes between the structure including the front part 25f and the attachment base 41, and the part of the peripheral wall portion 33 that surrounds the front part 25f and the attachment base 41. The washing water W1 is further unlikely to be directly sprayed on the hollow seal portion 45. The elastic deformation of the hollow seal portion 45 caused by the spraying of the washing water W1 is made even less likely to occur.

Also, the hollow seal portion 45 is in contact with the plate-shaped portion 32 and is also in contact with the inner wall surface 33a of the peripheral wall portion 33 at a position different from the position at which the hollow seal portion 45 is in contact with the plate-shaped portion 32. Therefore, even if the washing water W1 is sprayed, the pressure of the washing water W1 is received by the plate-shaped portion 32 and the peripheral wall portion 33 via the hollow seal portion 45. Since the washing water W1 is received at the two positions, the hollow seal portion 45 is unlikely to be elastically deformed.

Therefore, the modification shown in FIG. 9 has the same advantages of the items (3-1) and (3-2) in the third embodiment.

Figure 10:
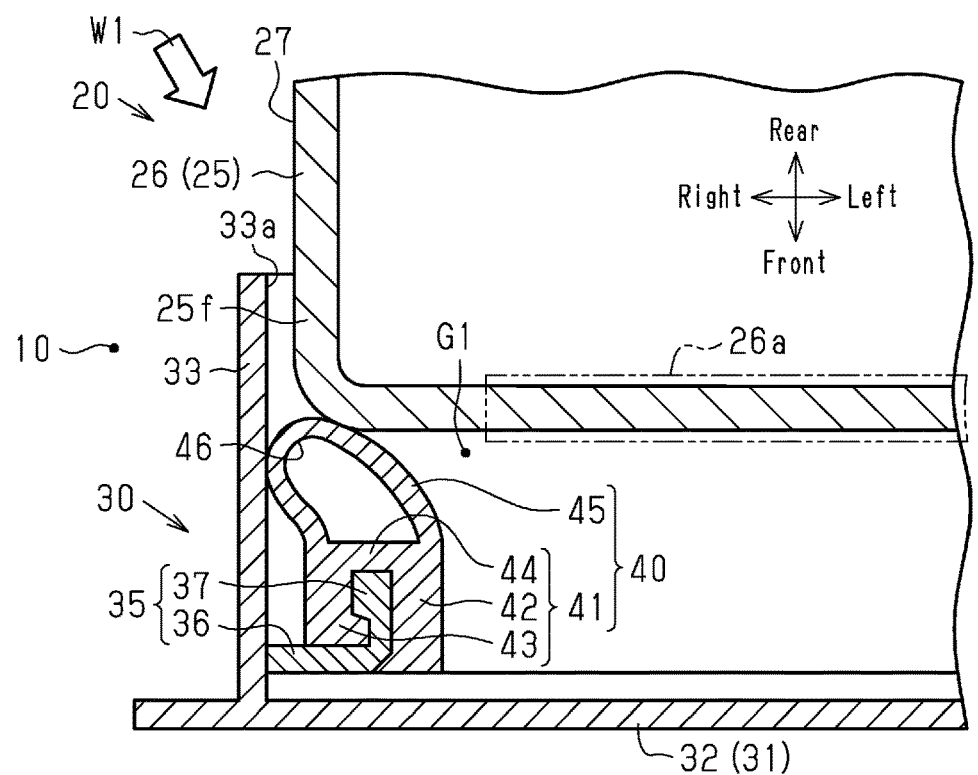
FIG. 10 is a cross-sectional plan view partially illustrating a sensor module according to a modification.

As shown in FIG. 10, the attachment base 41 of the seal member 40 may be attached to the peripheral wall portion 33 on the assumption that the peripheral wall portion 33 extends rearward from the plate-shaped portion 32 while surrounding the seal member 40.

In this case, for example, the base portion 36 of the attachment portion 35 is formed on the peripheral wall portion 33 instead of the plate-shaped portion 32. As shown in FIG. 10, the base portion 36 may be formed separately from the peripheral wall portion 33, or may be formed integrally with the peripheral wall portion 33. With this configuration, although the member on which the attachment portion 35 is formed is changed from the plate-shaped portion 32 to the peripheral wall portion 33, the attachment object of the seal member 40 is the cover body 31, which is common to the third embodiment. Therefore, the modification shown in FIG. 10 has the same advantages as the advantages of the items (3-1) and (3-2) in the third embodiment.

<Modification to Electromagnetic Wave Transmissive Cover 30>

The cover body 31 (see FIG. 5) in the second embodiment may be provided with a peripheral wall portion 33 similar to that in the third embodiment. The cover body 31 in the modification shown in FIG. 8 may be provided with a peripheral wall portion 33 similar to that in the modification shown in FIG. 9. Similar to the third embodiment and the modification shown in FIG. 9, the peripheral wall portion 33 may surround at least the front part 25f of the sensor device 25. Alternatively, although not illustrated, the peripheral wall portion 33 does not necessarily need to surround the sensor device 25. In the latter case, the rear end of the peripheral wall portion 33 may be located forward of the front surface of the sensor device 25.

In the third embodiment, the modification shown in FIG. 9, and the modification shown in FIG. 10, the peripheral wall portion 33 may extend from the plate-shaped portion 32 to a position rearward of the front part 25f of the sensor device 25.

<Modification to Seal Member 40>

The attachment base 41 and the hollow seal portion 45 may be formed in an annular shape different from a rectangular annular shape if the annular shape has a size capable of surrounding the electromagnetic wave transmissive portion 26a. Examples of the shape include an elliptical ring shape and a circular shape, and also include a polygonal annular shape different from a rectangular shape, such as a triangular shape and a pentagonal shape.

The hollow seal portion 45 may be formed separately from the attachment base 41 if the hollow seal portion 45 is joined to the attachment base 41.

The cross-sectional shape of the attachment base 41 may be changed.

OTHER MODIFICATIONS

The attachment locations of the sensor device 25 and the electromagnetic wave transmissive cover 30 to the land vehicle 10 may be changed to locations different from those in the above-described embodiments. For example, the sensor device 25 may be attached to the front grille 12 similarly to the electromagnetic wave transmissive cover 30.

The electromagnetic wave transmissive cover 30 can be employed in any land vehicle 10 on which the sensor device 25 that emits and receives electromagnetic waves for detecting objects outside the land vehicle 10 is mounted. In this case, electromagnetic waves emitted and received by the sensor device 25 include millimeter waves in addition to near-infrared rays. When the electromagnetic waves are millimeter waves, a millimeter wave radar device functions as the sensor device 25.

The sensor device 25, which emits and receives electromagnetic waves to detect objects outside the land vehicle 10, is not limited to a front monitoring device, but may be a device that monitors the situation behind the land vehicle 10, the situation on the sides of the front part of the land vehicle 10, or the situation on the sides of the rear part of the land vehicle 10. In these cases, the electromagnetic wave transmissive cover 30 is located forward of the sensor device 25 in the emission direction of millimeter waves.

The electromagnetic wave transmissive cover 30 may also serve as a vehicle exterior component such as an emblem, an ornament, or a mark.

The sensor module 20 can also be mounted on a vehicle of a type different from the land vehicle 10, for example, an aircraft or a ship. Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. An electromagnetic wave transmissive cover configured to be employed in a vehicle to which a sensor device is attached, the sensor device including an electromagnetic wave transmissive portion and being configured to emit and receive electromagnetic waves through the electromagnetic wave transmissive portion, the electromagnetic wave transmissive cover comprising:
   a cover body that is attached to the vehicle and covers the sensor device from a front side in an emission direction of the electromagnetic waves; and
   a seal member that provides a seal between the sensor device and the cover body, wherein
   the seal member includes:
      an attachment base portion that is attached to the cover body while surrounding the electromagnetic wave transmissive portion; and
      an annular hollow seal portion that is coupled to the attachment base portion and is in contact with the sensor device while surrounding the electromagnetic wave transmissive portion.

2. The electromagnetic wave transmissive cover according to claim 1, wherein
   a plane orthogonal to the emission direction and on which the sensor device and the hollow seal portion are projected is defined as a projection plane,
   in the projection plane, a center portion of each of the sensor device and the hollow seal portion is defined as a reference, and a direction toward the center portion is defined as an inward direction, and
   in the projection plane, an entirety of the hollow seal portion in a state of being in contact with the sensor device is disposed to be inward of an outer surface of the sensor device.

3. The electromagnetic wave transmissive cover according to claim 1, wherein
   the cover body includes:
      a plate-shaped portion disposed forward of the sensor device in the emission direction; and
      a peripheral wall portion extending rearward in the emission direction from the plate-shaped portion while surrounding the seal member, and a part of the hollow seal portion that is different from a portion in contact with the sensor device is in contact with an inner wall surface of the peripheral wall portion.

4. The electromagnetic wave transmissive cover according to claim 3, wherein the peripheral wall portion surrounds at least a front part of the sensor device in the emission direction.

5. A sensor module, comprising:
- a sensor device that is configured to be attached to a vehicle, includes an electromagnetic wave transmissive portion, and is configured to emit and receive electromagnetic waves through the electromagnetic wave transmissive portion;
- an electromagnetic transmissive cover that is configured to be attached to the vehicle and includes a cover body, the cover body covering the sensor device from a front side in an emission direction of the electromagnetic waves; and
- a seal member that provides a seal between the sensor device and the cover body, wherein
- one of the cover body and the sensor device serves as an attachment object to which the seal member is attached, and the other one of the cover body and the sensor device serves as a contact object with which the seal member is in contact, and
- the seal member includes:
  - an attachment base portion that is attached to the attachment object while surrounding the electromagnetic wave transmissive portion; and
  - an annular hollow seal portion that is coupled to the attachment base portion and is in contact with the contact object while surrounding the electromagnetic wave transmissive portion.

6. The sensor module according to claim 5, wherein
- a plane orthogonal to the emission direction and on which the sensor device and the hollow seal portion are projected is defined as a projection plane,
- in the projection plane, a center portion of each of the sensor device and the hollow seal portion is defined as a reference, and a direction toward the center portion is defined as an inward direction, and
- in the projection plane, an entirety of the hollow seal portion in a state of being in contact with the contact object is disposed to be inward of an outer surface of the sensor device.

7. The sensor module according to claim 5, wherein
the cover body includes:
- a plate-shaped portion disposed forward of the sensor device in the emission direction; and
- a peripheral wall portion extending rearward in the emission direction from the plate-shaped portion while surrounding the seal member, and
- a part of the hollow seal portion that is different from a portion in contact with the contact object is in contact with an inner wall surface of the peripheral wall portion.

8. The sensor module according to claim 7, wherein the peripheral wall portion surrounds at least a front part of the sensor device in the emission direction.

* * * * *